(12) United States Patent
Tanaka

(10) Patent No.: US 9,856,138 B2
(45) Date of Patent: Jan. 2, 2018

(54) ELECTRONIC DEVICE, PRESSURE SENSOR, ALTIMETER, ELECTRONIC APPARATUS, AND MOVING OBJECT

(71) Applicant: Seiko Epson Corporation, Tokyo (JP)

(72) Inventor: Nobuyuki Tanaka, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/995,401

(22) Filed: Jan. 14, 2016

(65) Prior Publication Data

US 2016/0214856 A1     Jul. 28, 2016

(30) Foreign Application Priority Data

Jan. 27, 2015   (JP) ................................. 2015-013014

(51) Int. Cl.
*G01L 9/00*    (2006.01)
*B81C 1/00*    (2006.01)

(52) U.S. Cl.
CPC .. *B81C 1/00182* (2013.01); *B81B 2201/0264* (2013.01); *B81B 2203/0127* (2013.01); *B81B 2207/07* (2013.01)

(58) Field of Classification Search
None
See application file for complete search history.

(56) References Cited

U.S. PATENT DOCUMENTS

| | | | |
|---|---|---|---|
| 7,709,912 B2 | 5/2010 | Sato et al. | |
| 7,880,245 B2 | 2/2011 | Sato et al. | |
| 8,410,561 B2 | 4/2013 | Sato et al. | |
| 8,536,662 B2 | 9/2013 | Witvrouw et al. | |
| 2008/0128841 A1* | 6/2008 | Fujimori | B81B 7/0058 257/418 |
| 2008/0224241 A1* | 9/2008 | Inaba | B81B 3/0075 257/415 |
| 2009/0217754 A1* | 9/2009 | Binda | G01C 5/06 73/384 |
| 2011/0126632 A1* | 6/2011 | McNeil | B81B 7/02 73/718 |
| 2012/0247217 A1* | 10/2012 | Suzuki | B25J 13/082 73/717 |
| 2013/0161702 A1* | 6/2013 | Chen | B81C 1/00246 257/254 |
| 2013/0270658 A1* | 10/2013 | Behrendt | B81B 3/0094 257/415 |

FOREIGN PATENT DOCUMENTS

| | | |
|---|---|---|
| JP | 2008-114354 A | 5/2008 |
| JP | 2011-115940 A | 6/2011 |
| JP | 2013-045893 A | 3/2013 |

* cited by examiner

*Primary Examiner* — Sitaramarao S Yechuri
(74) *Attorney, Agent, or Firm* — Oliff PLC

(57) ABSTRACT

An electronic device includes: a substrate; a piezoresistive element which is disposed on the side of the surface on one side of the substrate; a wall section which is disposed to surround the piezoresistive element in a plan view of the substrate, on the side of the surface on one side of the substrate; via wiring which is disposed on the side of the surface on one side of the substrate; and a covering layer which is disposed away from the via wiring in the plan view on the side opposite to the substrate with respect to the wall section and configures a cavity portion along with the substrate and the wall section.

20 Claims, 12 Drawing Sheets

ELECTRONIC DEVICE, PRESSURE SENSOR, ALTIMETER, ELECTRONIC APPARATUS, AND MOVING OBJECT

CROSS REFERENCE

This application claims the benefit of Japanese Application No. 2015-013014, filed on Jan. 27, 2015. The disclosure of the prior application is hereby incorporated by reference herein in its entirety.

BACKGROUND

1. Technical Field

The present invention relates to an electronic device, a pressure sensor, an altimeter, an electronic apparatus, and a moving object.

2. Related Art

An electronic device having a cavity portion formed by using a semiconductor manufacturing process is known (refer to, for example, JP-A-2013-45893). As an example of such an electronic device, for example, an electronic device disclosed in JP-A-2013-45893 is given, and the electronic device includes a substrate, a functional element disposed above the substrate, and a covering structure which defines a cavity portion in which the functional element is accommodated, and the covering structure has a first covering layer which has a through-hole communicating with the cavity portion and is disposed above the cavity portion, and a second covering layer which is disposed above the first covering layer and blocks the through-hole of the first covering layer. Here, the cavity portion is formed by etching through the through-hole of the first covering layer.

Further, in the electronic device disclosed in JP-A-2013-45893, the covering structure has a surrounding wall having a shape which surrounds the functional element when viewed in a plan view. The surrounding wall is configured by laminating a first metal layer and a second metal layer in the order of the first metal layer and the second metal layer from the substrate side. Then, the second metal layer is formed integrally with the first covering layer.

However, in the electronic device disclosed in JP-A-2013-45893, via wiring is disposed between the first metal layer and the second metal layer, and therefore, there is a problem in that a step is formed in accordance with the shape of the via wiring in the second metal layer (the first covering layer) and the step causes the occurrence of cracking of the second metal layer. For example, when a change in air pressure occurs, or the like, stress concentrates on the step of the second metal layer and thus cracking occurs in the second metal layer. If cracking occurs in the second metal layer, the collapse of the first covering layer and the second covering layer easily occurs, or a problem such as vacuum leakage of the cavity portion or the insufficient strength of the surrounding wall occurs due to the infiltration of an etching solution into an unwilling place when forming the cavity portion by etching through the through-hole of the first covering layer.

SUMMARY

An advantage of some aspects of the invention is to provide an electronic device having excellent reliability and provide a pressure sensor, an altimeter, an electronic apparatus, and a moving object which are provided with such an electronic device.

The advantage can be achieved by the invention described below.

Application Example 1

An electronic device according to this application example includes: a substrate; a wall section which is disposed annularly in a plan view of the substrate on a side of a surface on one side of the substrate; via wiring which is disposed on the side of the surface on one side of the substrate; and a covering layer which is disposed away from the via wiring in the plan view on a side opposite to the substrate with respect to the wall section and configures an internal space along with the substrate and the wall section.

According to such an electronic device, the covering layer is disposed away from the via wiring when viewed in a plan view, and therefore, it is possible to prevent or reduce a step being formed in accordance with the shape of the via wiring in the covering layer. For this reason, it is possible to prevent or reduce the occurrence of cracking in the covering layer. Accordingly, it is possible to provide an electronic device having excellent reliability.

Application Example 2

In the electronic device according to the application example, it is preferable that the covering layer has a through-hole.

With this configuration, when manufacturing the electronic device, it is possible to use the through-hole as a release hole and form the internal space by etching through the release hole (release etching). Further, when forming the internal space by such etching, if a step or cracking occurs in the covering layer, an etching solution infiltrates into an unwilling place, and thus a problem such as vacuum leakage of the internal space or the insufficient strength of the wall section occurs. Therefore, in such an electronic device, when the application example of the invention is applied, it is possible to prevent or reduce such a problem.

Application Example 3

In the electronic device according to the application example, it is preferable that the electronic device further includes a sealing layer which is disposed away from the via wiring in the plan view on a side opposite to the internal space of the covering layer, thereby blocking the through-hole.

With this configuration, it is possible to prevent or reduce peeling of the sealing layer.

Application Example 4

In the electronic device according to the application example, it is preferable that the wall portion includes a silicon compound.

With this configuration, it is possible to form the wall section by using a semiconductor manufacturing process.

Application Example 5

In the electronic device according to the application example, it is preferable that when a thickness of the covering layer is set to be A and a width of the internal space is set to be B, a value of A/B is within a range of 0.005 or more and 0.008 or less.

When being within such a range of the value of A/B, the covering layer easily collapses, and if a step occurs in the covering layer, cracking easily occurs in the covering layer. Therefore, in such a case, when the application example of the invention is applied, the effect becomes remarkable.

Application Example 6

In the electronic device according to the application example, it is preferable that the electronic device further includes a wiring layer having a portion which is disposed between the covering layer and the substrate.

With this configuration, it is possible to reduce an etching rate in a surface direction at the time of the release etching by the wiring layer. For this reason, by appropriately designing the shape of the wiring layer, it is possible to adjust the shape in a plan view of the internal space.

Application Example 7

In the electronic device according to the application example, it is preferable that the substrate has a diaphragm portion which is bent and deformed by receiving pressure, at a position where at least a portion overlap a ceiling portion when viewed in a plan view, and the diaphragm portion is provided with a sensor element which outputs an electrical signal by distortion.

With this configuration, it is possible to realize an electronic device (a physical quantity sensor) capable of detecting pressure.

Application Example 8

In the electronic device according to the application example, it is preferable that the electronic device further includes a circuit section which is disposed on the side of the surface on one side of the substrate.

With this configuration, it is possible to realize an electronic device in which a diaphragm portion and a circuit section configure a single chip.

Application Example 9

A pressure sensor according to this application example includes: the electronic device according to the above application example.

With this configuration, it is possible to provide a pressure sensor having excellent reliability.

Application Example 10

An altimeter according to this application example includes: the electronic device according to the above application example.

With this configuration, it is possible to provide an altimeter having excellent reliability.

Application Example 11

An electronic apparatus according to this application example includes: the electronic device according to the above application example.

With this configuration, it is possible to provide an electronic apparatus having excellent reliability.

Application Example 12

A moving object according to this application example includes: the electronic device according to the above application example.

With this configuration, it is possible to provide a moving object having excellent reliability.

BRIEF DESCRIPTION OF THE DRAWINGS

The invention will be described with reference to the accompanying drawings, wherein like numbers reference like elements.

FIGS. 3A and 3B are diagrams for describing an operation of the physical quantity sensor shown in FIG. 1, in which FIG. 3A is a cross-sectional view showing a pressurization state and FIG. 3B is a plan view showing a pressurization state.

FIGS. 10A and 10B are diagrams for describing a resonator with which the vibrator shown in FIG. 9 is provided, in which FIG. 10A is a cross-sectional view and FIG. 10B is a plan view.

DESCRIPTION OF EXEMPLARY EMBODIMENTS

Hereinafter, an electronic device, a pressure sensor, an altimeter, an electronic apparatus, and a moving object according to the invention will be described in detail based on the respective embodiments shown in the accompanying drawings.

1. Electronic Device

First Embodiment

Figure 1:
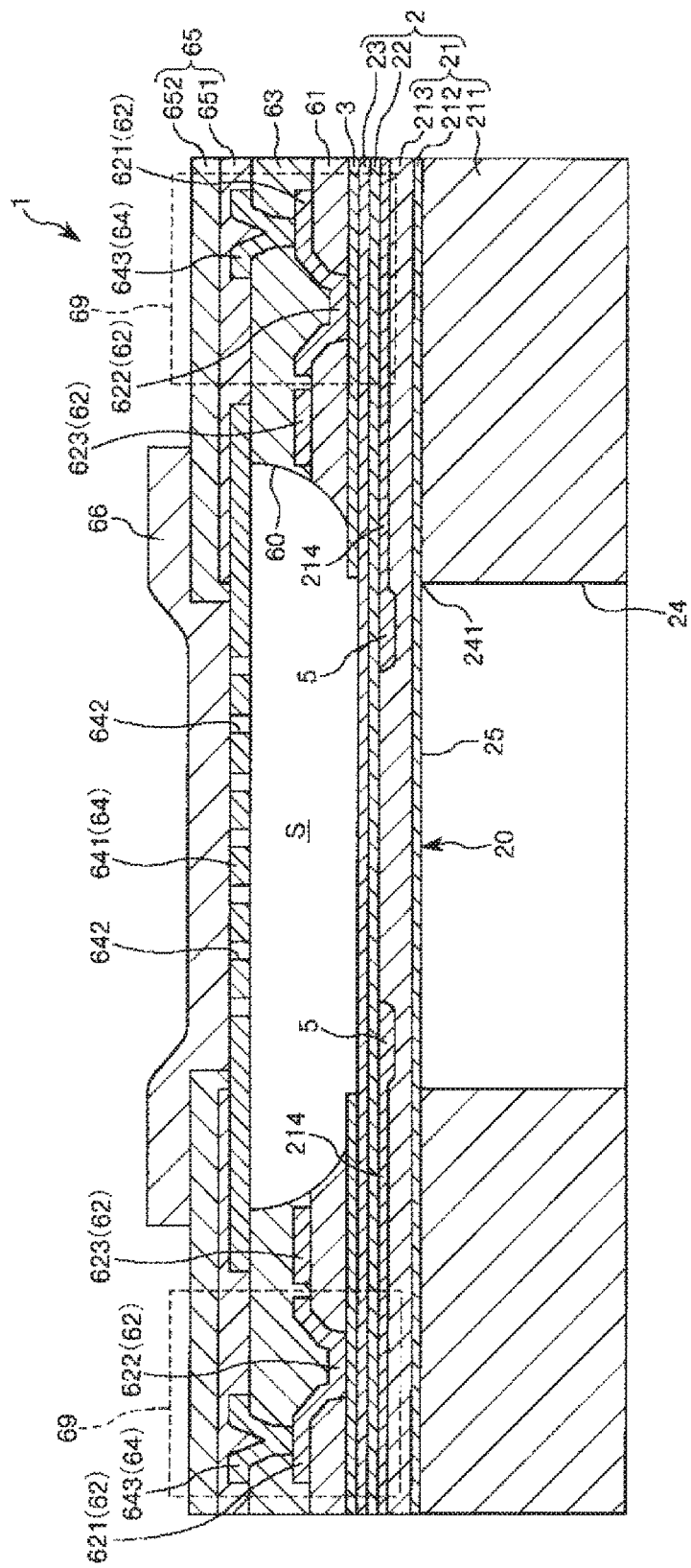
FIG. 1 is a cross-sectional view showing an electronic device (a physical quantity sensor) according to a first embodiment of the invention.
Figure 2:
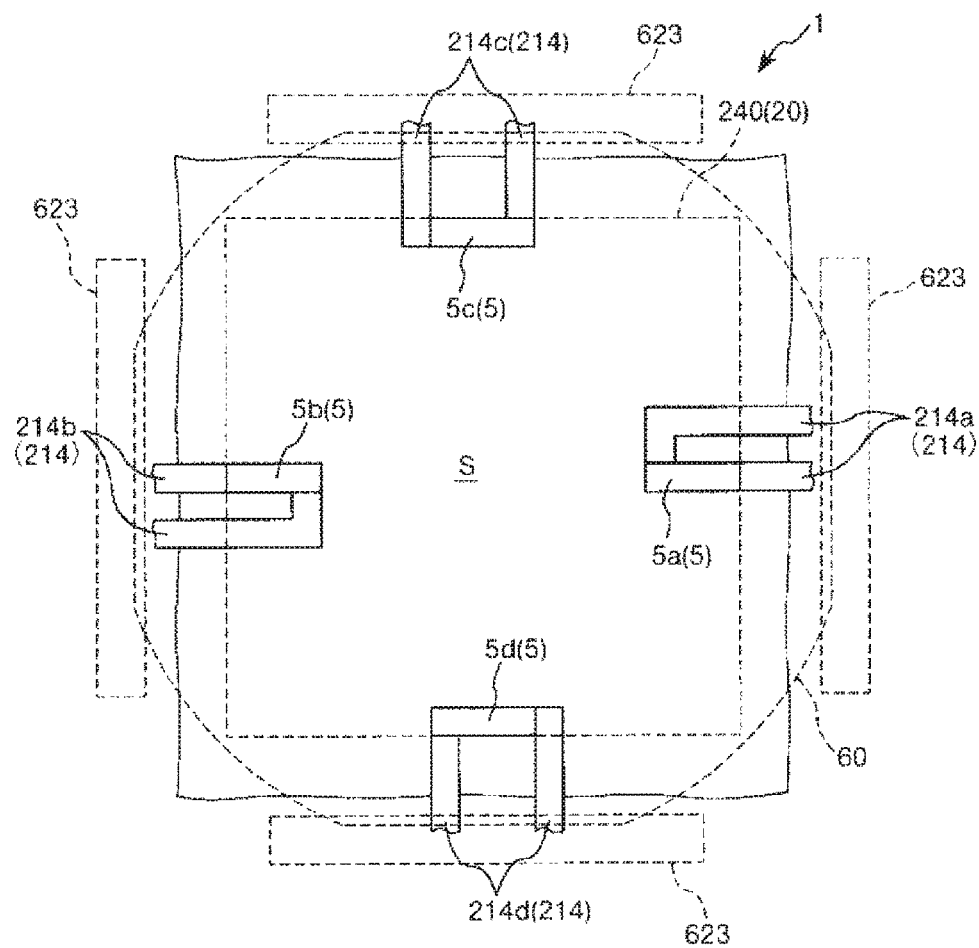
FIG. 2 is a plan view showing the disposition of a piezoresistive element (a sensor element) and a wall section of the physical quantity sensor shown in FIG. 1.
Figure 3A:
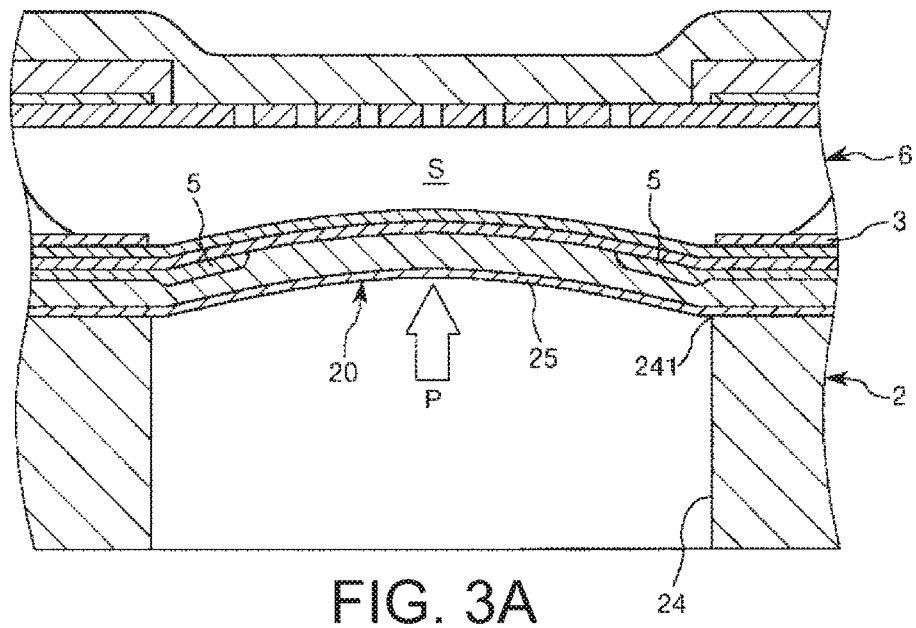
Figure 3B:
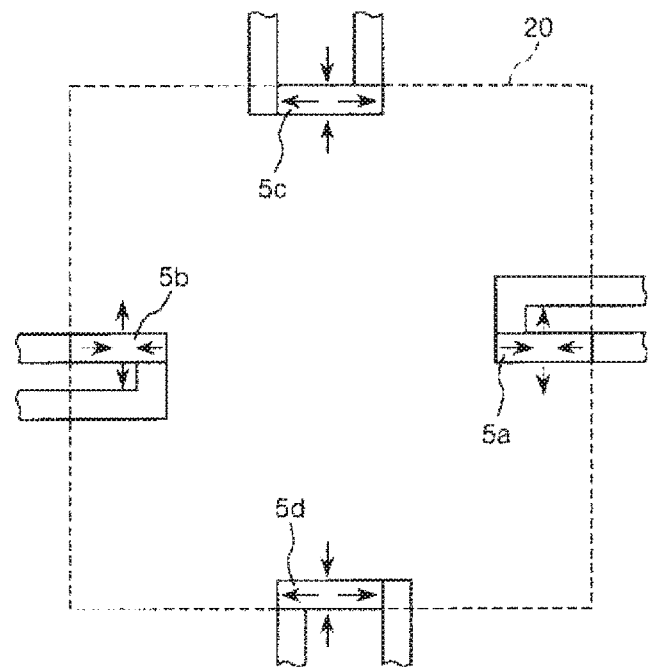

FIG. 1 is a cross-sectional view showing an electronic device (a physical quantity sensor) according to a first embodiment of the invention. FIG. 2 is a plan view showing the disposition of a piezoresistive element (a sensor element) and a wall section of the physical quantity sensor shown in FIG. 1. FIGS. 3A and 3B are diagrams for describing an operation of the physical quantity sensor shown in FIG. 1, in which FIG. 3A is a cross-sectional view showing a pressurization state and FIG. 3B is a plan view showing a pressurization state. In addition, in the following, for convenience of description, the upper side in FIG. 1 is referred to as a "top" and the lower side is referred to as a "bottom".

A physical quantity sensor 1 which is the electronic device shown in FIG. 1 is provided with a substrate 2 having a diaphragm portion 20, a plurality of piezoresistive elements 5 (sensor elements) that are functional elements which are disposed at the diaphragm portion 20, a laminated structure 6 which forms a cavity portion S (an internal space) along with the substrate 2, and an intermediate layer 3 which is disposed between the substrate 2 and the laminated structure 6.

Hereinafter, the respective sections configuring the physical quantity sensor 1 will be described sequentially.

Substrate

The substrate 2 has a semiconductor substrate 21, an insulating film 22 provided on the surface on one side of the semiconductor substrate 21, and an insulating film 23 provided on the surface on the side opposite to the semiconductor substrate 21 of the insulating film 22.

The semiconductor substrate 21 is an SOI substrate in which a silicon layer 211 (a handle layer) configured with single-crystal silicon, a silicon oxide layer 212 (a box layer) configured with a silicon oxide film, and a silicon layer 213 (a device layer) configured with single-crystal silicon are laminated in this order. In addition, the semiconductor substrate 21 is not limited to the SOI substrate and may be other semiconductor substrates such as a single-crystal silicon substrate.

The insulating film 22 is, for example, a silicon oxide film and has insulation properties. Further, the insulating film 23 is, for example, a silicon nitride film and has insulation properties and also has resistance properties to an etching solution containing hydrofluoric acid. Here, due to the insulating film 22 (a silicon oxide film) being interposed between the semiconductor substrate 21 (the silicon layer 213) and the insulating film 23 (a silicon nitride film), stress generated at the time of the formation of the insulating film 23 being transmitted to the semiconductor substrate 21 can be alleviated by the insulating film 22. Further, the insulating film 22 can also be used as an inter-element isolation film in a case where a semiconductor circuit is formed on and above the semiconductor substrate 21. In addition, the insulating films 22 and 23 are not limited to the constituent materials described above and either of the insulating films 22 and 23 may be omitted, as necessary.

The intermediate layer 3 patterned is disposed on the insulating film 23 of the substrate 2. The intermediate layer 3 is formed so as to surround the diaphragm portion 20 when viewed in a plan view, and a stepped portion having a thickness corresponding to the thickness of the intermediate layer 3 is formed between the upper surface of the intermediate layer 3 and the upper surface of the substrate 2 and on the center side (the inside) of the diaphragm portion 20. In this way, when the diaphragm portion 20 is bent and deformed by receiving pressure, it is possible to concentrate stress on a boundary portion between the diaphragm portion 20 and the stepped portion. For this reason, by disposing the piezoresistive element 5 at such a boundary portion (or in the vicinity thereof), it is possible to improve detection sensitivity.

The intermediate layer 3 is configured with, for example, single-crystal silicon, polycrystalline silicon (polysilicon), or amorphous silicon. Further, the intermediate layer 3 may be configured by doping (diffusing or implanting) impurities such as phosphorous or boron to, for example, single-crystal silicon, polycrystalline silicon (polysilicon), or amorphous silicon. In this case, the intermediate layer 3 has electric conductivity, and therefore, for example, a portion of the intermediate layer 3 can be used as a gate electrode of a MOS transistor (not shown) of a circuit section 69. Further, a portion of the intermediate layer 3 can be used as wiring.

The diaphragm portion 20 which is thinner in thickness than a peripheral portion and is bent and deformed by receiving pressure is provided in the substrate 2. The diaphragm portion 20 is formed by providing a bottomed concave portion 24 in the lower surface of the semiconductor substrate 21. That is, the diaphragm portion 20 is configured to include a bottom portion of the concave portion 24 which is open in the surface on one side of the substrate 2. The lower surface of the diaphragm portion 20 serves as a pressure receiving surface 25. In this embodiment, as shown in FIG. 2, the diaphragm portion 20 has a shape in a plan view of a square (rectangular).

In the substrate 2 of this embodiment, the concave portion 24 penetrates through the silicon layer 211 and the diaphragm portion 20 is configured with four layers; the silicon oxide layer 212, the silicon layer 213, the insulating film 22, and the insulating film 23. Here, the silicon oxide layer 212 can be used as an etching stop layer when forming the concave portion 24 by etching in a manufacturing process of the physical quantity sensor 1, as will be described later, and thus it is possible to reduce a variation in the thickness of the diaphragm portion 20 for each product.

In addition, a configuration is also possible in which the concave portion 24 does not penetrate through the silicon layer 211 and the diaphragm portion 20 is configured with five layers; a thin-walled portion of the silicon layer 211, the silicon oxide layer 212, the silicon layer 213, the insulating film 22, and the insulating film 23.

Piezoresistive Element (Functional Element)

The plurality of piezoresistive elements 5 are formed on the cavity portion S side of the diaphragm portion 20, as shown in FIG. 1. Here, the piezoresistive elements 5 are formed at the silicon layer 213 of the semiconductor substrate 21.

As shown in FIG. 2, the plurality of piezoresistive elements 5 are configured with a plurality of piezoresistive elements 5a, 5b, 5c, and 5d disposed at an outer peripheral portion of the diaphragm portion 20.

The piezoresistive element 5a, the piezoresistive element 5b, the piezoresistive element 5c, and the piezoresistive element 5d are respectively disposed to correspond to four sides of the diaphragm portion 20 having a quadrangular shape in a plan view viewed from a thickness direction of the substrate 2 (hereinafter referred to simply as a "plan view").

The piezoresistive element 5a extends along a direction perpendicular to a corresponding side of the diaphragm portion 20. Then, a pair of wiring 214a is electrically connected to both end portions of the piezoresistive element 5a. Similarly, the piezoresistive element 5b extends along a direction perpendicular to a corresponding side of the diaphragm portion 20. Then, a pair of wiring 214b is electrically connected to both end portions of the piezoresistive element 5b.

On the other hand, the piezoresistive element 5c extends along a direction parallel to a corresponding side of the diaphragm portion 20. Then, a pair of wiring 214c is electrically connected to both end portions of the piezoresistive element 5c. Similarly, the piezoresistive element 5d extends along a direction parallel to a corresponding side of the diaphragm portion 20. Then, a pair of wiring 214d is electrically connected to both end portions of the piezoresistive element 5d.

In addition, in the following, the wiring 214a, the wiring 214b, the wiring 214c, and the wiring 214d are also collectively referred to as "wiring 214".

Each of the piezoresistive element 5 and the wiring 214 is configured with, for example, silicon (single-crystal silicon) with impurities such as phosphorous or boron doped (diffused or implanted) thereto. Here, the doping concentration of the impurities in the wiring 214 is higher than the doping concentration of the impurities in the piezoresistive element 5. In addition, the wiring 214 may be configured with metal.

Further, the plurality of piezoresistive elements 5 are configured such that, for example, the resistance values in a natural state are equal to each other.

The piezoresistive elements 5 as described above configure a bridge circuit (a Wheatstone bridge circuit) through the wiring 214 or the like. A drive circuit (not shown) which supplies drive voltage is connected to the bridge circuit. Then, in the bridge circuit, a signal having a potential difference corresponding to the resistance value of the piezoresistive element 5 is output as a detection signal.

Laminated Structure

The laminated structure 6 is formed so as to define the cavity portion S between itself and the substrate 2 described above. Here, the laminated structure 6 is disposed on the piezoresistive element 5 side of the diaphragm portion 20, thereby defining and forming (configuring) the cavity portion S (the internal space) along with the diaphragm portion 20 (or the substrate 2).

The laminated structure 6 has an interlayer insulation film 61 formed on the substrate 2 so as to surround the piezoresistive elements 5 when viewed in a plan view, a wiring layer 62 formed on the interlayer insulation film 61, an interlayer insulation film 63 formed on the wiring layer 62 and the interlayer insulation film 61, a wiring layer 64 which is formed on the interlayer insulation film 63 and has a covering layer 641 provided with a plurality of pores 642 (through-holes), a surface protection film 65 formed on the wiring layer 64 and the interlayer insulation film 63, and a sealing layer 66 provided on the covering layer 641.

Each of the interlayer insulation films 61 and 63 is configured with, for example, a silicon oxide film. Further, each of the wiring layers 62 and 64 and the sealing layer 66 is configured with metal such as aluminum. Further, the sealing layer 66 seals the plurality of pores 642 of the covering layer 641. Further, the surface protection film 65 is configured by laminating a $SiO_2$ layer 651 which is a silicon oxide film and a SiN layer 652 which is a silicon nitride film in this order. Here, mainly, the SiN layer 652 has a surface protection function, and the $SiO_2$ layer 651 has a function of increasing a close contact property with the SiN layer 652 or flatness.

Further, the wiring layer 62 has a wiring portion 621 which is disposed between the interlayer insulation film 61 and the interlayer insulation film 63, via wiring 622 which is connected to the wiring portion 621 and penetrates through the interlayer insulation film 61, and a guard portion 623 which is disposed further toward the cavity portion S side than the via wiring 622 between the interlayer insulation film 61 and the interlayer insulation film 63.

Further, the wiring layer 64 has the covering layer 641 which covers the cavity portion S and has the plurality of pores 642, and via wiring 643 which penetrates through the interlayer insulation film 63 and is connected to the wiring portion 621 of the wiring layer 62. Further, although not shown in the drawings, the wiring layer 64 has a pad portion which is connected to the via wiring 643 and is exposed from the surface protection film 65.

Here, the circuit section 69 having wiring composed of the wiring portion 621 and the via wiring 622 of the wiring layer 62 and the via wiring 643 of the wiring layer 64 is electrically connected to the piezoresistive elements 5. Further, although not shown in the drawings, the circuit section 69 has a MOS transistor connected to such wiring. In this manner, the circuit section 69 is disposed on the side of the surface on one side (the piezoresistive element 5 side) of the substrate 2, whereby it is possible to realize the physical quantity sensor 1 in which the diaphragm portion 20 and the circuit section 69 configure a single chip.

In the laminated structure 6, a structure composed of the interlayer insulation films 61 and 63 configures a "wall section 60" which is annularly disposed to surround the piezoresistive elements 5 when viewed in a plan view, on the side of the surface on one side of the substrate 2. Further, the via wiring 622 and the via wiring 643 are disposed on the side of the surface on one side (the piezoresistive element 5 side) of the substrate 2, and the covering layer 641 is disposed apart from the via wiring 622 when viewed in a plan view, on the side opposite to the substrate 2 with respect to the wall section 60, thereby configuring the cavity portion S (the internal space) along with the substrate 2 and the wall section. In this way, it is possible to prevent or reduce a step being formed in accordance with the shape of the via wiring 622 in the covering layer 641. For this reason, it is possible to prevent or reduce the occurrence of cracking in the covering layer 641. Accordingly, it is possible to provide the physical quantity sensor 1 having excellent reliability. In addition, in this regard, it will be described in detail later.

Further, the laminated structure 6 can be formed by using a semiconductor manufacturing process such as a CMOS process. In addition, the circuit section 69 which is a semiconductor circuit is fabricated on or above the silicon layer 213. However, the circuit section 69 has, in addition to the wiring and the MOS transistor described above, circuit elements such as a capacitor, an inductor, a resistor, a diode, and wiring (including wiring which is connected to the piezoresistive element 5), which are formed as necessary.

The cavity portion S defined by the substrate 2 and the laminated structure 6 is a hermetically-sealed space. The cavity portion S functions as a pressure reference chamber which becomes a reference value of pressure which the physical quantity sensor 1 detects. In this embodiment, the cavity portion S is in a vacuum state (300 Pa or less). The cavity portion S is made be in a vacuum state, whereby the physical quantity sensor 1 can be used as an "absolute pressure sensor" which detects pressure with a vacuum state as a reference, and the convenience thereof is improved.

However, the cavity portion S may not be in a vacuum state and may be in an atmospheric pressure state and may be in a reduced pressure state in which air pressure is lower than atmospheric pressure, or may be in a pressurization state in which air pressure is higher than atmospheric pressure. Further, the cavity portion S may be filled with inert gas such as nitrogen gas or noble gas.

The configuration of the physical quantity sensor 1 has been briefly described above.

In the physical quantity sensor 1 having such a configuration, as shown in FIG. 3A, the diaphragm portion 20 is deformed according to pressure P which the pressure receiving surface 25 of the diaphragm portion 20 receives, whereby the piezoresistive elements 5a, 5b, 5c, and 5d are distorted, as shown in FIG. 3B, and thus the resistance values of the piezoresistive elements 5a, 5b, 5c, and 5d change. Accordingly, the output of the bridge circuit which is configured with the piezoresistive elements 5a, 5b, 5c, and 5d changes, and the magnitude of the pressure received by the pressure receiving surface 25 can be determined based on the output.

More specifically, in a natural state before the deformation of the diaphragm portion 20 as described above occurs, for example, in a case where the resistance values of the piezoresistive elements 5a, 5b, 5c, and 5d are equal to each other, the product of the resistance values of the piezoresistive elements 5a and 5b and the product of the resistance values of the piezoresistive elements 5c and 5d are equal to each other, and thus the output (the potential difference) of the bridge circuit becomes zero.

On the other hand, if the deformation of the diaphragm portion 20 as described above occurs, as shown in FIG. 3B, in the piezoresistive elements 5a and 5b, compressive strain along a longitudinal direction thereof and tensile strain along a width direction thereof occur, and in the piezoresistive elements 5c and 5d, tensile strain along a longitudinal direction thereof and compressive strain along a width direction thereof occur. Therefore, when the deformation of the diaphragm portion 20 as described above occurs, the resistance values on one side of the resistance values of the piezoresistive elements 5a and 5b and the resistance values of the piezoresistive elements 5c and 5d increase and the resistance values on the other side decrease.

Due to the distortion of the piezoresistive elements 5a, 5b, 5c, and 5d, a difference between the product of the resistance values of the piezoresistive elements 5a and 5b and the product of the resistance values of the piezoresistive elements 5c and 5d occurs, and output (a potential difference) corresponding to the difference is output from the bridge circuit. The magnitude (absolute pressure) of the pressure received by the pressure receiving surface 25 can be determined based on the output from the bridge circuit.

Here, when the deformation of the diaphragm portion 20 as described above occurs, the resistance values on one side of the resistance values of the piezoresistive elements 5a and 5b and the resistance values of the piezoresistive elements 5c and 5d increase and the resistance values on the other side decrease. Therefore, it is possible to increase a change in a difference between the product of the resistance values of the piezoresistive elements 5a and 5b and the product of the resistance values of the piezoresistive elements 5c and 5d, and accordingly, it is possible to increase the output from the bridge circuit. As a result, it is possible to increase pressure detection sensitivity.

In this manner, in the physical quantity sensor 1, the diaphragm portion 20 of the substrate 2 is provided at a position overlapping the covering layer 641 when viewed in a plan view, thereby being bent and deformed by receiving pressure. In this way, it is possible to realize the physical quantity sensor 1 capable of detecting pressure. Further, the piezoresistive element 5 disposed at the diaphragm portion 20 is a sensor element which outputs an electrical signal due to distortion, and therefore, it is possible to increase pressure detection sensitivity. Further, as described above, the outline of the diaphragm portion 20 has a rectangular shape when viewed in a plan view, and therefore, it is possible to increase pressure detection sensitivity.

Wall Section and Covering Layer

Hereinafter, the wall section 60 and the covering layer 641 will be described in detail.

In general, as will be described later, if the interlayer insulation film 61, the wiring layer 62, the interlayer insulation film 63, and the wiring layer 64 are formed to be laminated in this order, although illustration is omitted in FIG. 1, a step (a concave portion) according to the shape of the via wiring 622 is formed in the interlayer insulation film 63 or the surface protection film 65 over the via wiring 622. If the covering layer 641 is formed on the step, a step is formed in the covering layer 641 as well, and stress easily concentrates on the step portion, and thus there is a case where cracking occurs in the covering layer 641.

Therefore, as described above, the covering layer 641 is disposed away from the via wiring 622 when viewed in a plan view, on the side opposite to the substrate 2 with respect to the wall section 60. That is, when viewed in a plan view, the covering layer 641 does not overlap the via wiring 622. In this way, it is possible to dispose an outer peripheral portion of the covering layer 641 on a flat area of the interlayer insulation film 63, and thus it is possible to prevent or reduce a step being formed in accordance with the shape of the via wiring 622 in the covering layer 641. For this reason, it is possible to prevent or reduce the occurrence of cracking in the covering layer 641. Accordingly, it is possible to provide the physical quantity sensor 1 having excellent reliability.

In particular, when the thickness of the covering layer 641 is set to be A and the width of the cavity portion S is set to be B, when the value of A/B is within a range of 0.005 or more to 0.008 or less, the covering layer 641 easily collapses, and if a step occurs in the covering layer 641, cracking easily occurs in the covering layer 641. Therefore, in such a case, when the invention is applied, the effect becomes remarkable.

Further, as will be described in detail later, when manufacturing the physical quantity sensor 1, the pore 642 is used as a release hole and the cavity portion S is formed by etching (release etching) through the pore 642. However, when the cavity portion S is formed by such etching, if a step or cracking occurs in the covering layer 641, an etching solution infiltrates into an unwilling place, and thus a problem such as vacuum leakage of the cavity portion S or the insufficient strength of the wall section 60 occurs. Therefore, in the physical quantity sensor 1, when the invention is applied, it is possible to prevent or reduce such a problem.

Further, in this manner, in a case where the covering layer 641 is disposed so as not to overlap the via wiring 622 when viewed in a plan view, the wall surface of the wall section 60 is configured mainly with the interlayer insulation films 61 and 63. Therefore, the wall section 60 includes a silicon compound (for example, $SiO_2$). The wall section 60 can be formed by using a semiconductor manufacturing process, as will be described later.

In this embodiment, the guard portion 623 of the wiring layer 62 has a portion which is disposed between the covering layer 641 and the substrate 2 (refer to FIGS. 1 and 2). In this way, it is possible to reduce an etching rate in a surface direction at the time of the release etching by the guard portion 623. For this reason, by appropriately designing the shape of the guard portion 623, it is possible to adjust the shape in a plan view of the cavity portion S. Here, via wiring is not disposed between the guard portion 623 and the substrate 2 and between the guard portion 623 and the covering layer 641. Therefore, as described above, it is possible to prevent or reduce the formation of a step in the covering layer 641 or the sealing layer 66.

In addition, in FIG. 2, a case where four guard portions 623 are respectively provided along the sides of the diaphragm portion 20 having a quadrangular shape when viewed in a plan view is shown as an example. However, the guard portion 623 may be annularly disposed so as to surround the entire circumference of the diaphragm portion 20 when viewed in a plan view. Further, the guard portion 623 may be electrically connected and may not be electrically connected to the circuit section 69. However, it is preferable that the guard portion 623 is electrically connected to a constant potential (for example, a ground potential). In this way, it is possible to use the guard portion 623 as a magnetic shield.

Further, the sealing layer 66 is disposed away from the via wiring 622 and the via wiring 643 when viewed in a plan view, on the side opposite to the cavity portion S of the covering layer 641. In this way, it is possible to dispose an outer peripheral portion of the sealing layer 66 on a flat area of the surface protection film. 65, and thus it is possible to prevent or reduce peeling of the sealing layer 66.

Method of Manufacturing Physical Quantity Sensor

Next, a method of manufacturing the physical quantity sensor 1 will be briefly described.

FIGS. 4A to 6C are diagrams showing manufacturing processes of the physical quantity sensor shown in FIG. 1. Hereinafter, a method of manufacturing the physical quantity sensor 1 will be described based on these drawings.

Element Formation Process

Figure 4A:
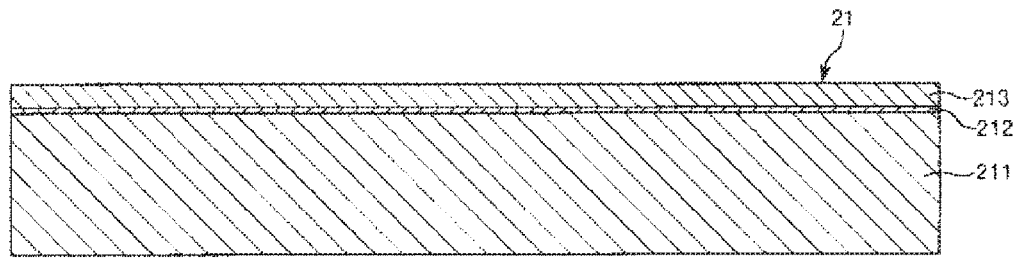
FIGS. 4A to 4D are diagrams showing manufacturing processes of the physical quantity sensor shown in FIG. 1.

First, as shown in FIG. 4A, the semiconductor substrate 21 which is an SOI substrate is prepared.

Figure 4B:
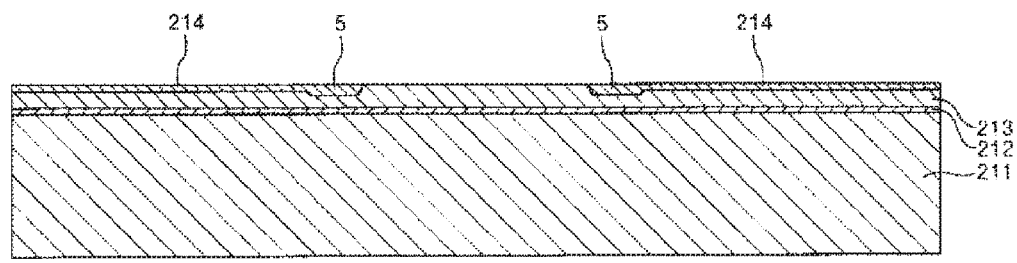

Then, as shown FIG. 4B, the plurality of piezoresistive elements 5 and wiring 214 are formed by doping (ion-implanting) impurities such as phosphorus (n-type) or boron (p-type) to the silicon layer 213 of the semiconductor substrate 21.

For example, in a case of performing ion implantation of boron at +80 keV, ion implantation concentration to the piezoresistive element 5 is set to be about $1\times10^{14}$ atoms/cm$^2$. Further, ion implantation concentration to the wiring 214 is set to be more than that of the piezoresistive element 5. For example, in a case of performing ion implantation of boron at 10 keV, ion implantation concentration to the wiring 214 is set to be about $5\times10^{15}$ atoms/cm$^2$. Further, after the ion implantation as described above, for example, annealing at about 1000° C. and for about 20 minutes is performed.

Process of Forming Insulating Film and the Like

Figure 4C:
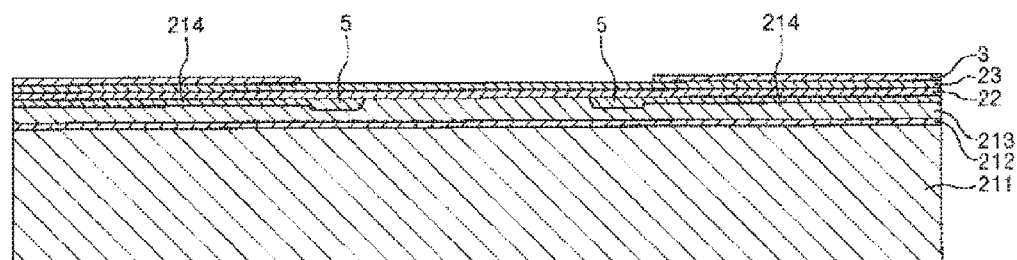

Next, as shown in FIG. 4C, the insulating film 22, the insulating film 23, and the intermediate layer 3 are formed in this order on the silicon layer 213.

The formation of each of the insulating films 22 and 23 can be performed by, for example, a sputtering method, a CVD method, or the like. The intermediate layer 3 can be formed, for example, by forming a polycrystalline silicon film by a sputtering method, a CVD method, or the like and then doping (ion-implanting) impurities such as phosphorus or boron to the film, as necessary, and thereafter, performing patterning by etching.

Interlayer Insulation Film and Wiring Layer Formation Process

Figure 4D:
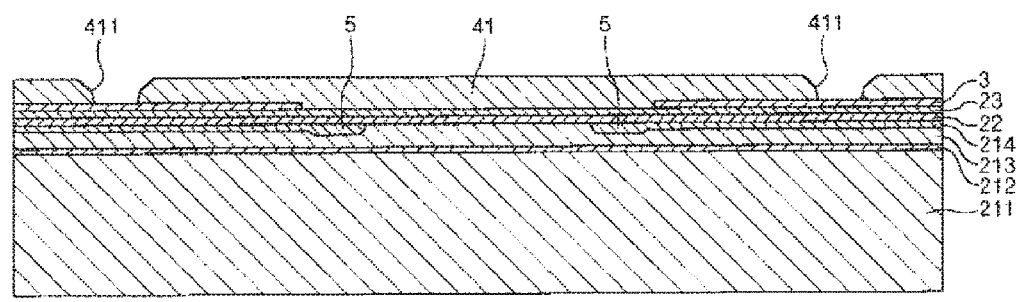

Next, as shown in FIG. 4D, a sacrificial layer 41 is formed on the insulating film 23.

The sacrificial layer 41 is partially removed by a cavity portion formation process which will be described later, and the remainder becomes the interlayer insulation film 61, and the sacrificial layer 41 has a through-hole 411 through which the wiring layer 62 penetrates. The formation of the sacrificial layer 41 is performed by forming a silicon oxide film by a sputtering method, a CVD method, or the like and patterning the silicon oxide film by etching.

Further, the thickness of the sacrificial layer 41 is not particularly limited. However, the thickness is set to be in a range of 1500 nm or more and 5000 nm or less, for example.

Figure 5A:
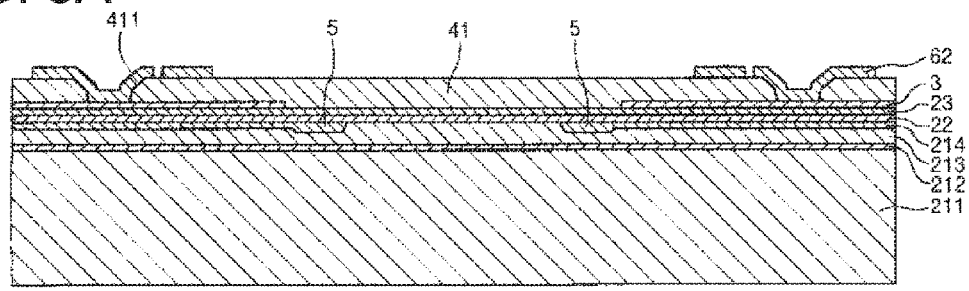
FIGS. 5A to 5D are diagrams showing manufacturing processes of the physical quantity sensor shown in FIG. 1.

Next, as shown in FIG. 5A, the wiring layer 62 is formed so as to fill the through-hole 411 formed in the sacrificial layer 41.

The formation of the wiring layer 62 can be performed, for example, by forming a uniform conductor film by a sputtering method, a CVD method, or the like and then patterning the conductor film. Although not shown in the drawings, in a case where the wiring layer 62 is formed by using aluminum, prior to deposition of aluminum, a glue layer composed of, for example, a Ti layer and a TiN layer may be formed on the wall surface of the through-hole 411. Further, after aluminum is uniformly deposited, an antireflection layer composed of, for example, a TiN layer may be formed on the aluminum film.

Further, the thickness of the wiring layer 62 is not particularly limited. However, the thickness is set to be in a range of 300 nm or more and 900 nm or less, for example.

Figure 5B:
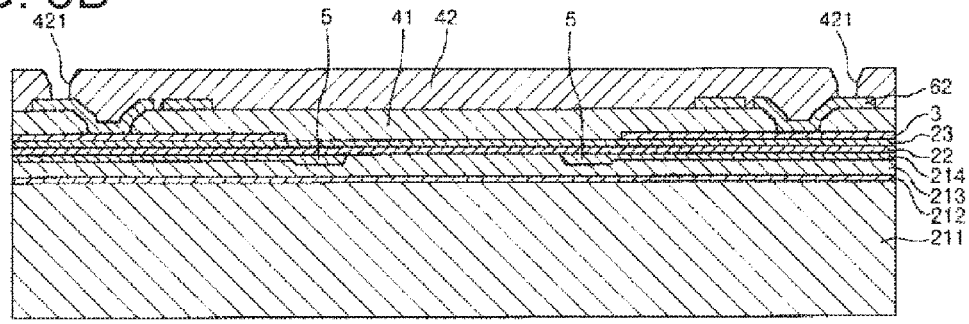

Next, as shown in FIG. 5B, a sacrificial layer 42 is formed on the sacrificial layer 41 and the wiring layer 62.

The sacrificial layer 42 is partially removed by the cavity portion formation process which will be described later and the remainder becomes the interlayer insulation film 63, and the sacrificial layer 42 has a through-hole 421 through which the wiring layer 64 penetrates. The formation of the sacrificial layer 42 is performed by forming a silicon oxide film by a sputtering method, a CVD method, or the like and patterning the silicon oxide film by etching, similar to the formation of the sacrificial layer 41 described above.

Further, the thickness of the sacrificial layer 42 is not particularly limited. However, the thickness is set to be in a range of 1500 nm or more and 5000 nm or less, for example.

Figure 5C:
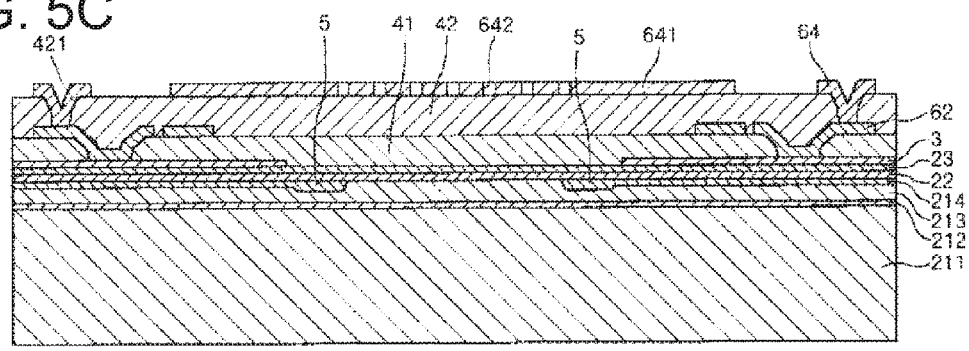

Next, as shown in FIG. 5C, the wiring layer 64 is formed so as to fill the through-hole 421 formed in the sacrificial layer 42.

The formation of the wiring layer 64 can be performed, for example, by forming a uniform conductor film by a sputtering method, a CVD method, or the like and then patterning the conductor film. Although not shown in the drawings, in a case where the wiring layer 64 is formed by using aluminum, prior to deposition of aluminum, a glue layer composed of, for example, a Ti layer and a TiN layer may be formed on each wall surface of the through-hole 421. Further, after aluminum is uniformly deposited, an antireflection layer composed of, for example, a TiN layer may be formed on the aluminum film.

Further, the thickness of the wiring layer 64 is not particularly limited. However, the thickness is set to be in a range of 300 nm or more and 900 nm or less, for example.

The sacrificial layers 41 and 42 and the wiring layers 62 and 64 are formed in the manner as described above. In addition, a laminated structure composed of the sacrificial layers 41 and 42 and the wiring layers 62 and 64 is formed by using a normal CMOS process and the number of layers is appropriately set, as necessary. That is, there is also a case where even more sacrificial layers or wiring layers are laminated, as necessary.

Figure 5D:
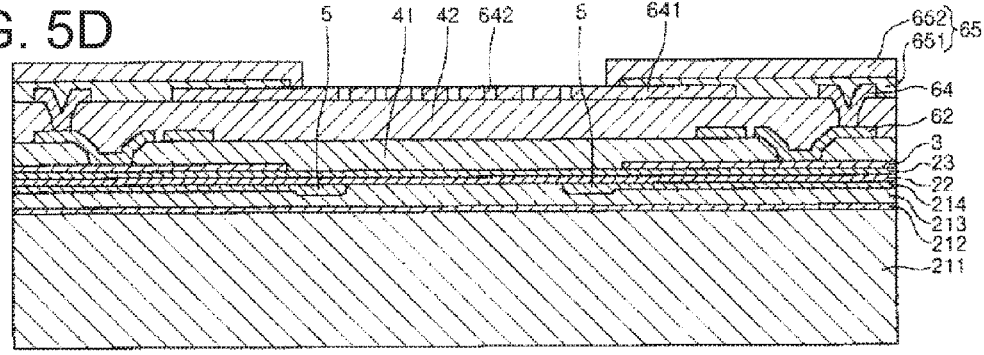

Thereafter, as shown in FIG. 5D, the surface protection film 65 is formed by a sputtering method, a CVD method, or the like. In this way, at the time of etching in the cavity portion formation process which will be described later, it is possible to protect portions which become the interlayer insulation films 61 and 62, of the sacrificial layers 41 and 42.

Here, when forming the surface protection film 65 having the SiO$_2$ layer 651 and the SiN layer 652 described above, the SiO$_2$ layer 651 and the SiN layer 652 are formed by uniformly forming a SiO$_2$ layer and a SiN layer in this order and then patterning these layers.

In addition, the configuration of the surface protection film 65 is not limited to that described above. As a constituent material of the surface protection film 65, a material having resistance properties for protecting an element from moisture, dust, a scratch, or the like, such as a silicon oxide film, a silicon nitride film, a polyimide film, or an epoxy resin film, can be given as an example, and in particular, a silicon nitride film is suitable.

The thickness of the surface protection film 65 is not particularly limited. However, the thickness is set to be in a range of 500 nm or more and 2000 nm or less, for example.

Cavity Portion Formation Process

Figure 6A:
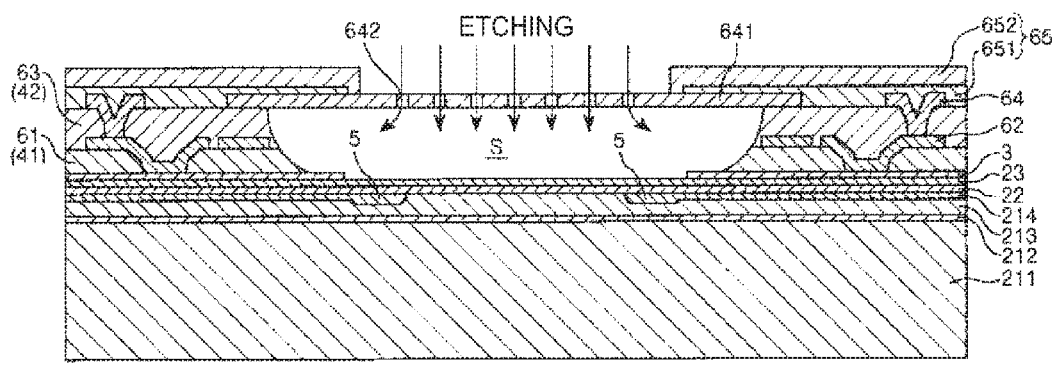
FIGS. 6A to 6C are diagrams showing manufacturing processes of the physical quantity sensor shown in FIG. 1.

Next, as shown in FIG. 6A, the cavity portion S (a cavity) is formed between the insulating film 23 and the covering layer 641 by partially removing the sacrificial layers 41 and 42. In this way, the interlayer insulation films 61 and 63 are formed.

The formation of the cavity portion S is performed by partially removing the sacrificial layers 41 and 42 by etching (release etching) through the plurality of pores 642 formed in the covering layer 641. Here, in a case where wet etching is used as such etching, an etching solution such as hydrofluoric acid or buffered hydrofluoric acid is supplied from the plurality of pores 642, and in a case where dry etching is used, etching gas such as hydrofluoric acid gas is supplied from the plurality of pores 642. At the time of such etching, the insulating film 23 functions as an etching stop layer. Further, the insulating film 23 has resistance properties to an etching solution, and therefore, the insulating film 23 also has a function of protecting configuration sections (for example, the insulating film 22, the piezoresistive elements 5, the wiring 214, and the like) below the insulating film 23 from an etching solution.

Further, such etching is performed until an end on the substrate 2 side of the cavity portion S when viewed in a plan view includes the concave portion 24 of the substrate 2. In this way, in a process of forming the concave portion 24 which will be described later, it is possible to form the diaphragm portion 20 configured with a bottom portion of the concave portion 24.

Sealing Process

Figure 6B:
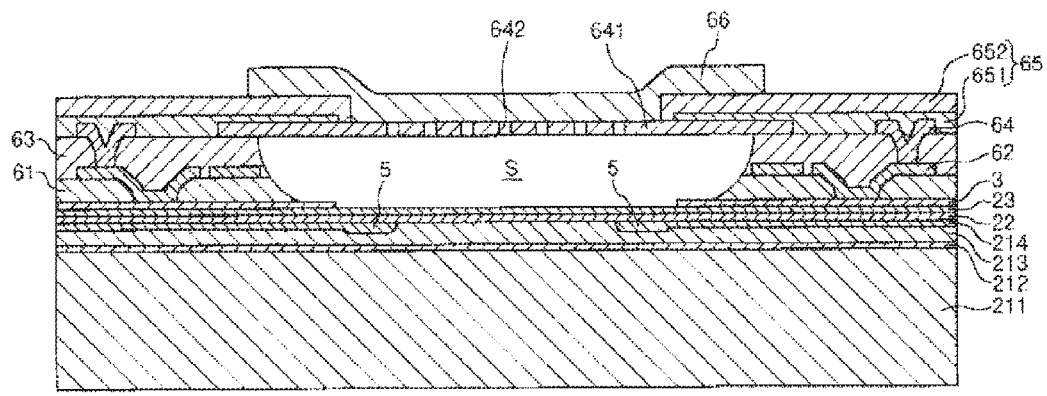

Next, as shown in FIG. 6B, the sealing layer 66 composed of a silicon oxide film, a silicon nitride film, a metal film such as Al, Cu, W, Ti, or TiN, or the like is formed on the covering layer 641 by a sputtering method, a CVD method, or the like, thereby sealing the respective pores 642. In this way, the cavity portion S is sealed by the sealing layer 66 and the laminated structure 6 is obtained.

Here, the thickness of the sealing layer 66 is not particularly limited. However, the thickness is set to be in a range of 1000 nm or more and 5000 nm or less, for example.

Diaphragm Formation Process

Figure 6C:
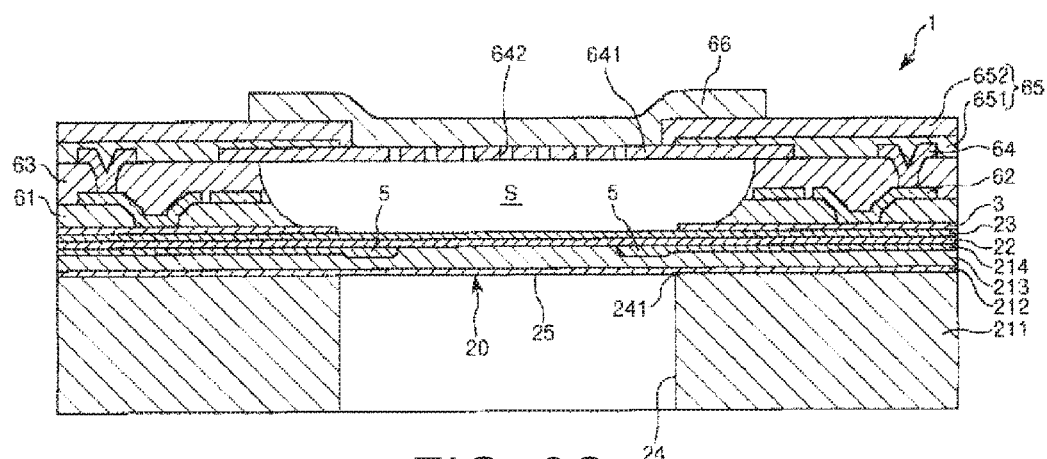

Next, after the lower surface of the silicon layer 211 is ground, as necessary, the concave portion 24 is formed by removing (machining) a portion of the lower surface of the silicon layer 211 by etching, as shown in FIG. 6C. In this way, the diaphragm portion 20 facing the covering layer 641 through the cavity portion S is formed.

Here, when removing a portion of the lower surface of the silicon layer 211, the silicon oxide layer 212 functions as an etching stop layer. In this way, it is possible to define the thickness of the diaphragm portion 20 with high accuracy.

In addition, as a method of removing a portion of the lower surface of the silicon layer 211, dry etching is also acceptable and wet etching or the like is also acceptable.

The physical quantity sensor 1 can be manufactured through the processes as described above.

Second Embodiment

Next, a second embodiment of the invention will be described.

Figure 7:
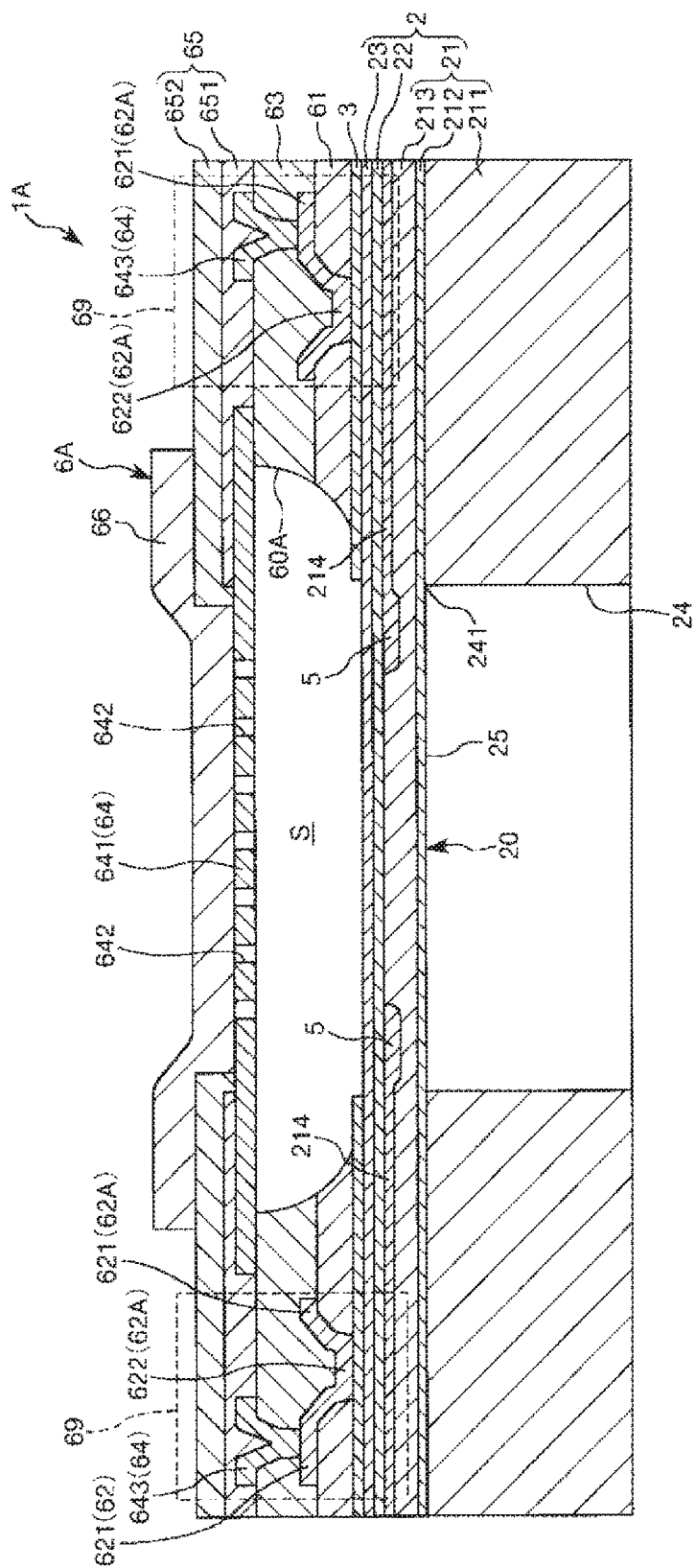
FIG. 7 is a cross-sectional view showing an electronic device (a physical quantity sensor) according to a second embodiment of the invention.
Figure 8:
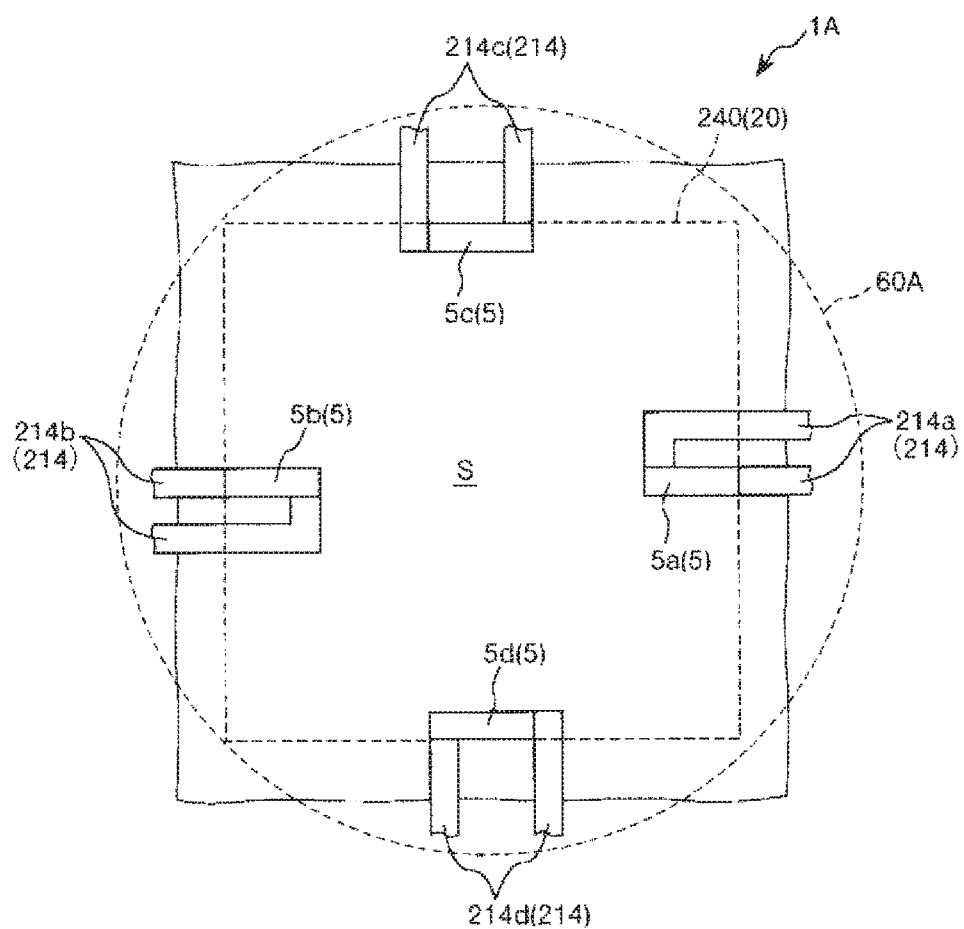
FIG. 8 is a plan view showing the disposition of a piezoresistive element (a sensor element) and a wall section of the physical quantity sensor shown in FIG. 7.

FIG. 7 is a cross-sectional view showing an electronic device (a physical quantity sensor) according to a second embodiment of the invention. FIG. 8 is a plan view showing the disposition of a piezoresistive element (a sensor element) and a wall section of the physical quantity sensor shown in FIG. 7.

Hereinafter, the second embodiment of the invention will be described. However, a description is made focusing on differences from the embodiment described above, and with respect to the same matters, a description thereof is omitted.

This embodiment is the same as the first embodiment described above, except that the configuration of a wiring layer is different.

A physical quantity sensor 1A (an electronic device) shown in FIG. 7 is the same as the physical quantity sensor 1 of the first embodiment described above, except that the guard portion 623 is omitted and accordingly, the shape in a plan view of the cavity portion S is different.

That is, the physical quantity sensor 1A is provided with a laminated structure 6A having a wiring layer 62A having the wiring portion 621 and the via wiring 622, and the wiring layer 62A is not disposed between the covering layer 641 and the substrate 2. In the physical quantity sensor 1A, the shape in a plan view of a wall section 60A of the cavity portion S is a circular shape, as shown in FIG. 8.

Also by the second embodiment as described above, it is possible to realize excellent reliability.

Third Embodiment

Next, a third embodiment of the invention will be described.

Figure 9:
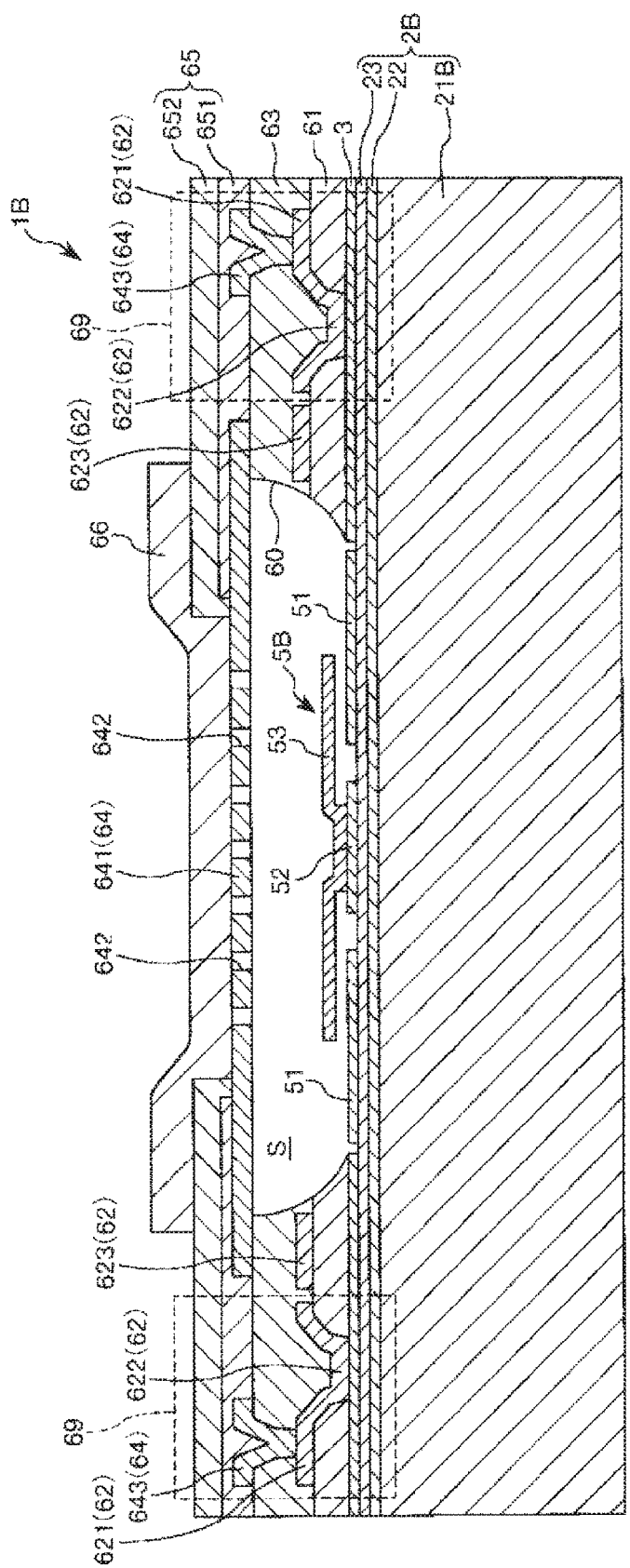
FIG. 9 is a cross-sectional view showing an electronic device (a vibrator) according to a third embodiment of the invention.
Figure 10A:
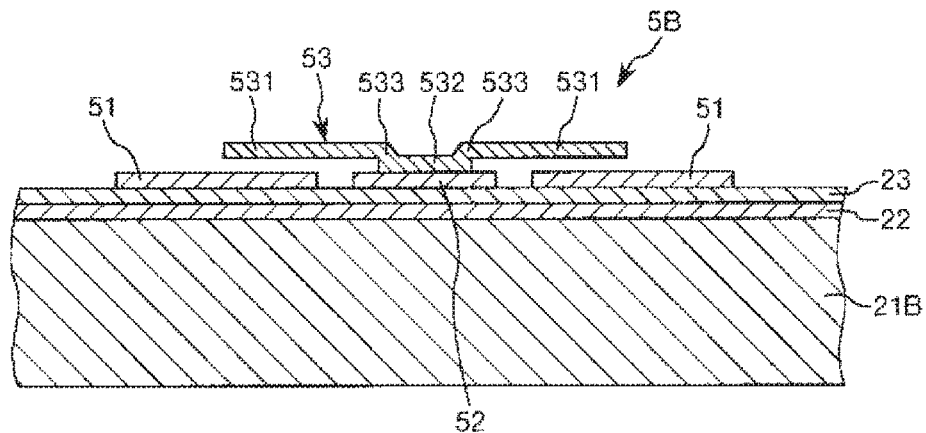
Figure 10B:
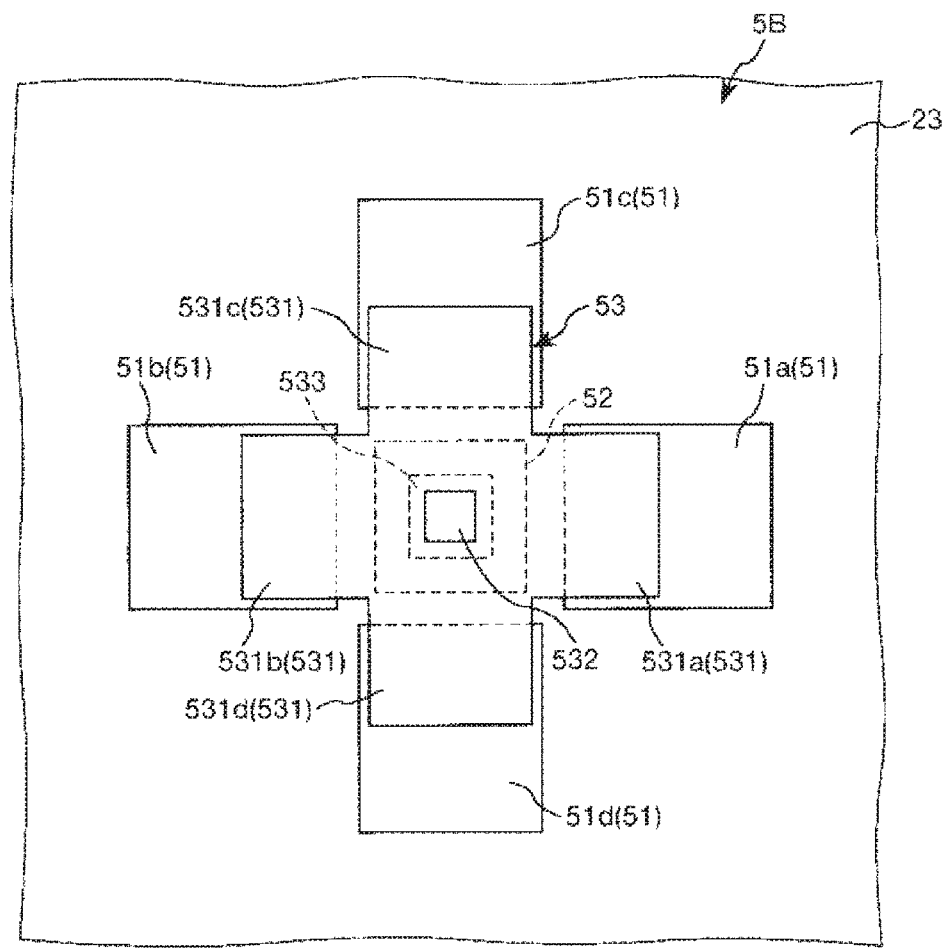

FIG. 9 is a cross-sectional view showing an electronic device (a vibrator) according to the third embodiment of the invention. FIGS. 10A and 10B are diagrams for describing a resonator with which the vibrator shown in FIG. 9 is provided, in which FIG. 10A is a cross-sectional view and FIG. 10B is a plan view.

Hereinafter, the third embodiment of the invention will be described. However, a description is made focusing on differences from the embodiment described above, and with respect to the same matters, a description thereof is omitted.

This embodiment is the same as the first embodiment described above, except that the electronic device according to the invention is applied to a vibrator.

An electronic device 1B shown in FIG. 9 has the same configuration as the physical quantity sensor 1 of the first embodiment described above, except that the electronic device 1B is provided with a substrate 2B and a resonator 5B (a functional element), instead of the substrate 2 and the piezoresistive element 5. That is, the electronic device 1B is provided with the substrate 2B, the resonator 5B which is a functional element disposed at the substrate 2B, the laminated structure 6 which forms the cavity portion S (the internal space) along with the substrate 2B, and the intermediate layer 3 disposed between the substrate 2B and the laminated structure 6.

Here, the substrate 2B has a semiconductor substrate 21B, the insulating film 22 provided on the surface on one side of the semiconductor substrate 21B, and the insulating film 23 provided on the surface on the side opposite to the semiconductor substrate 21B of the insulating film 22.

The semiconductor substrate 21B is a flat plate and is, for example, a silicon single crystal substrate. In addition, as the semiconductor substrate 21B, an SOI substrate may be used.

The resonator 5B has four lower electrodes 51, a lower electrode 52, and an upper electrode 53 supported on the lower electrode 52.

The four lower electrodes 51 (fixed electrodes) are configured with two lower electrodes 51a and 51b arranged along a first direction (a right-left direction in FIG. 10B) with the lower electrode 52 interposed therebetween when viewed in a plan view, and two lower electrodes 51c and 51d arranged along a second direction (a up-down direction in FIG. 10B) orthogonal to the first direction with the lower electrode 52 interposed therebetween. Further, each of the four lower electrodes 51 is disposed to be spaced apart from the lower electrode 52 when viewed in a plan view.

The two lower electrodes 51a and Sib are electrically connected to each other through wiring (not shown), thereby being configured so as to have the same potential as each other. Similarly, the two lower electrodes 51c and 51d are electrically connected to each other through wiring (not shown), thereby being configured so as to have the same potential as each other.

The upper electrode 53 (a vibrating body) has four movable portions 531 (movable electrodes), a fixed portion 532 fixed to the lower electrode 52, and a connection portion 533 connecting each of the movable portions 531 and the fixed portion 532.

The four movable portions 531 are provided to correspond to the four lower electrodes 51 described above, and each of the movable portions 531 faces a corresponding lower electrode 51 with a distance therebetween. That is, the four movable portions 531 are configured with two movable portions 531a and 531b arranged along the first direction (the right-left direction in FIG. 10B) with the fixed portion 532 interposed therebetween, and two movable portions 531c and 531d arranged along the second direction (the up-down direction in FIG. 10B) orthogonal to the first direction with the fixed portion 532 interposed therebetween.

Each of the lower electrodes 51 and 52 and the upper electrode 53 is configured by doping (diffusing or implanting) impurities such as phosphorus or boron to single-crystal silicon, polycrystalline silicon (polysilicon), or amorphous silicon and has electric conductivity. Further, the lower electrodes 51 and 52 can be formed together with the intermediate layer 3.

In the electronic device 1B configured in this manner, a first voltage (alternating voltage) which periodically changes is applied between the lower electrodes 51a and 51b and the upper electrode 53, and a second voltage which is the same as the first voltage except that a phase is shifted 180° is applied between the lower electrodes 51c and 51d and the upper electrode 53.

Then, the movable portions 531a and 531b perform flexural vibration by being alternately displaced in a direction approaching the lower electrodes 51a and 51b and a direction being separated from the lower electrodes 51a and 51b, and the movable portions 531c and 531d perform flexural vibration by being alternately displaced in a direction approaching the lower electrodes 51c and 51d and a direction being separated from the lower electrodes 51c and 51d, in a reverse phase to the movable portions 531a and 531b. That is, when the movable portions 531a and 531b are displaced in the direction approaching the lower electrodes 51a and 51b, the movable portions 531c and 531d is displaced in the direction being separated from the lower electrodes 51c and 51d, and on the other hand, when the movable portions 531a and 531b are displaced in the direction being separated from the lower electrodes 51a and 51b, the movable portions 531c and 531d is displaced in the direction approaching the lower electrodes 51c and 51d.

In this manner, by causing the movable portions 531a and 531b and the movable portions 531c and 531d to vibrate in a reverse phase, it is possible to cause vibration which is transmitted from the movable portions 531a and 531b to the fixed portion 532 and vibration which is transmitted from the movable portions 531c and 531d to the fixed portion 532 to be offset each other. As a result, it is possible to reduce these vibrations leaking to the outside through the fixed portion 532, so-called vibration leakage, and thus increase the vibration efficiency of the electronic device 1B. In this manner, in the electronic device 1B, due to the number of movable portions 531 being a plural number, it is possible to reduce vibration leakage from the movable portion 531 to the outside.

The electronic device 1B is combined with, for example, an oscillation circuit (a drive circuit), thereby being able to be used as an oscillator which extracts a signal having a predetermined frequency. In addition, such an oscillation circuit can be provided as a semiconductor circuit (for example, the circuit section 69) on the substrate 2B.

2. Pressure Sensor

Figure 11:
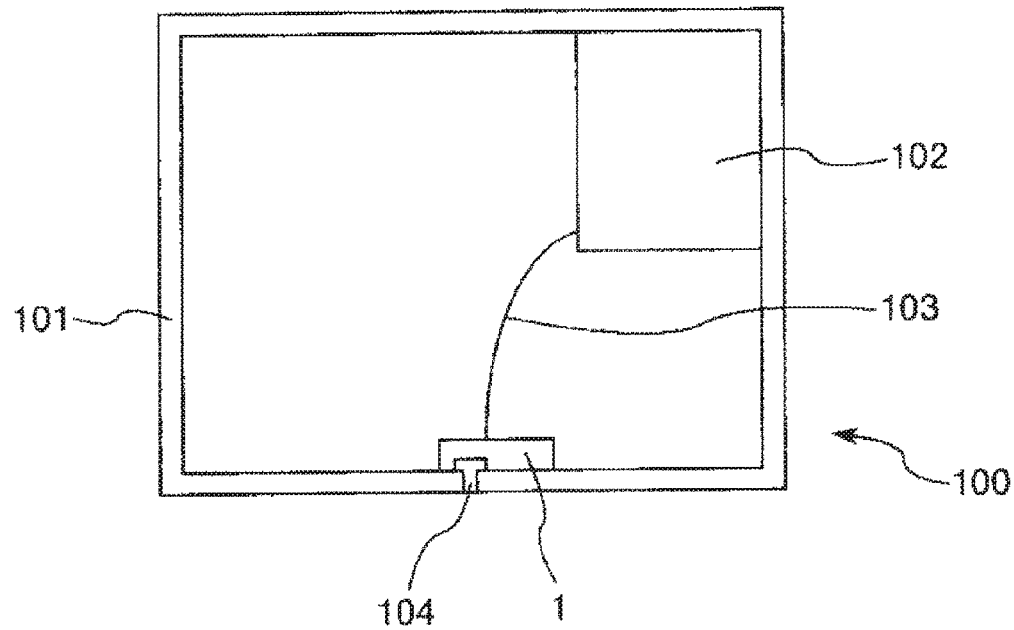
FIG. 11 is a cross-sectional view showing an example of a pressure sensor according to the invention.

Next, a pressure sensor (a pressure sensor according to the invention) which is provided with the electronic device according to the invention will be described. FIG. 11 is a cross-sectional view showing an example of the pressure sensor according to the invention.

As shown in FIG. 11, a pressure sensor 100 according to the invention is provided with the physical quantity sensor 1, a casing 101 which accommodates the physical quantity sensor 1, and a calculation unit 102 which calculates a signal obtained from the physical quantity sensor 1 into pressure data. The physical quantity sensor 1 is electrically connected to the calculation unit 102 through wiring 103.

The physical quantity sensor 1 is fixed to the inside of the casing 101 by fixing means (not shown). Further, the casing 101 has a through-hole 104 for causing the diaphragm portion 20 of the physical quantity sensor 1 to communicate with, for example, the air (the outside of the casing 101).

According to the pressure sensor 100, the diaphragm portion 20 receives pressure through the through-hole 104. A pressure receiving signal is transmitted to the calculation unit through the wiring 103 and calculated into pressure data. The calculated pressure data can be displayed through a display section (for example, a monitor of a personal computer, or the like) (not shown).

3. Altimeter

Figure 12:
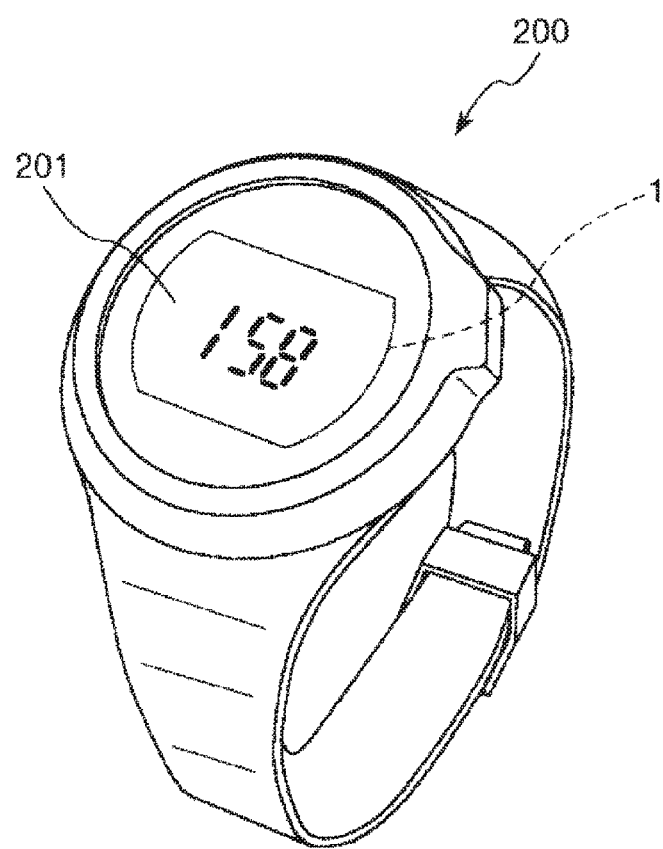
FIG. 12 is a perspective view showing an example of an altimeter according to the invention.

Next, an example of an altimeter (an altimeter according to the invention) which is provided with the electronic device according to the invention will be described. FIG. 12 is a perspective view showing an example of the altimeter according to the invention.

An altimeter 200 can be worn on the wrist, like a wristwatch. Further, the physical quantity sensor 1 (the pressure sensor 100) is mounted on the inside of the altimeter 200, and an altitude from a sea level of a present location, or air pressure or the like of a present location can be displayed on a display section 201.

Further, a variety of information such as a current time, a heart rate of a user, or weather can be displayed on a display section 201.

4. Electronic Apparatus

Figure 13:
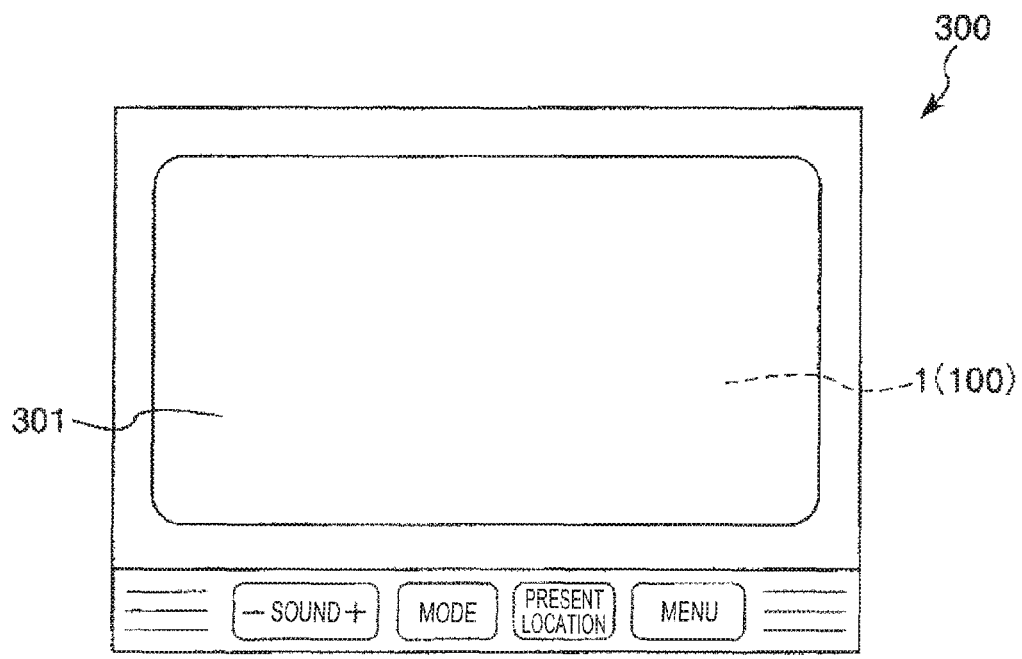
FIG. 13 is a front view showing an example of an electronic apparatus according to the invention.

Next, a navigation system to which an electronic apparatus which is provided with the electronic device according to the invention is applied will be described. FIG. 13 is a front view showing an example of the electronic apparatus according to the invention.

A navigation system 300 is provided with position information acquisition means from map information (not shown) and a global positioning system (GPS), self-contained navigation means by a gyro sensor, an acceleration sensor, and vehicle speed data, the physical quantity sensor 1, and a display section 301 which displays predetermined position information or course information.

According to the navigation system, in addition to the acquired position information, altitude information can be acquired. For example, in a case of traveling on an elevated road which shows substantially the same position as that of a general road with regard to position information, when there is no altitude information, whether a vehicle travels on the general road or on the elevated road cannot be determined in the navigation system, and thus information on the general road is provided to a user as priority information. Therefore, in the navigation system 300 according to this embodiment, altitude information can be acquired by the physical quantity sensor 1, and it is possible to detect a change in altitude due to entry from a general road into an elevated road, thereby providing navigation information in a traveling state on the elevated road to a user.

Further, the display section 301 has a configuration capable of being reduced in size and being made thinner, such as a liquid crystal panel display or an organic electroluminescence (organic EL) display, for example.

In addition, the electronic apparatus which is provided with the electronic device according to the invention is not limited to those described above and can be applied to, for example, a personal computer, a mobile phone, medical equipment (for example, an electronic thermometer, a sphygmomanometer, a blood glucose meter, an electrocardiogram measuring device, an ultrasonic diagnostic device, or an electronic endoscope), various measuring instruments, meters and gauges (for example, meters and gauges of a vehicle, an aircraft, or a ship), a flight simulator, or the like.

5. Moving Object

Figure 14:
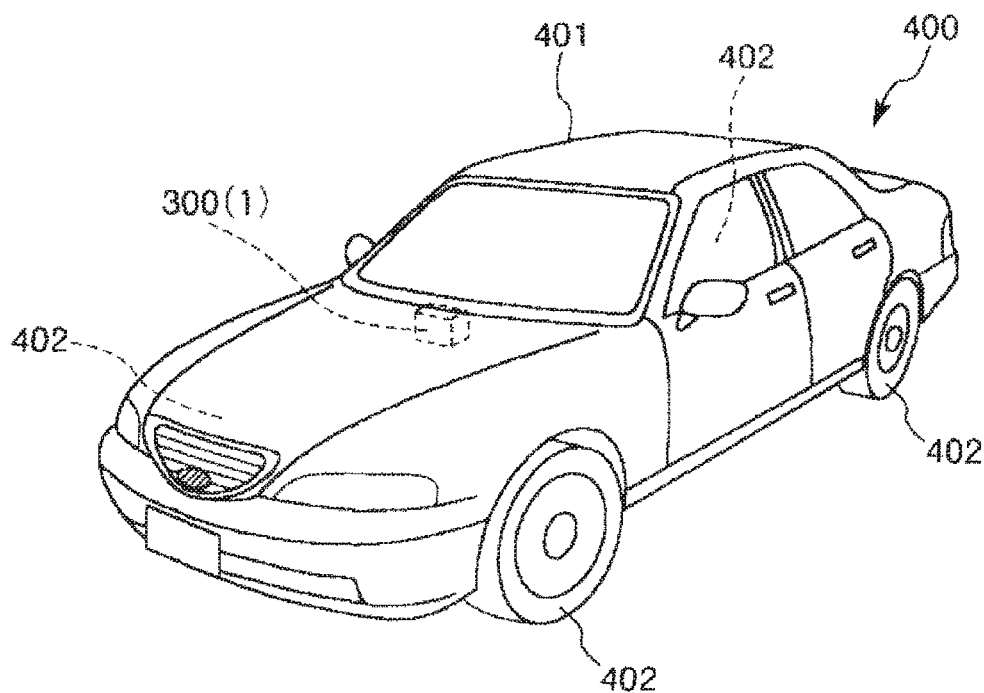
FIG. 14 is a perspective view showing an example of a moving object according to the invention.

Subsequently, a moving object (a moving object according to the invention) to which the electronic device according to the invention is applied will be described. FIG. 14 is a perspective view showing an example of the moving object according to the invention.

As shown in FIG. 14, a moving object 400 has a car body 401 and four wheels 402 and is configured so as to rotate the wheels 402 by a power source (an engine) (not shown) provided at the car body 401. The navigation system 300 (the physical quantity sensor 1) is built in the moving object 400.

The electronic device, the pressure sensor, the altimeter, the electronic apparatus, and the moving object according to the invention have been described above based on the respective embodiments illustrated. However, the invention is not limited thereto and the configuration of each section can be replaced with any configuration having the same function. Further, any other configuration may be added thereto.

Further, in the embodiments described above, a case where the number of piezoresistive elements (functional element) which are provided at a single diaphragm portion is four has been described as an example. However, there is no limitation thereto and the number may be, for example, one or more and three or less, or may be five or more. Further, the disposition, the shape, or the like of the piezoresistive element is also not limited to that in the embodiments described above, and for example, in the embodiments described above, the piezoresistive element may be disposed at a central portion of the diaphragm portion.

Further, in the embodiments described above, a case of using a piezoresistive element as a sensor element which detects the deflection of a diaphragm portion has been described as an example. However, as such an element, there is no limitation thereto and, for example, a resonator is also acceptable.

Further, in the embodiments described above, a case where the electronic device according to the invention is applied to a physical quantity sensor or a vibrator has been described as an example. However, there is no limitation thereto and it is possible to apply the invention to various electronic devices in which a wall section and a ceiling portion are formed on a substrate by using a semiconductor manufacturing process, as described above, and an internal space is formed by the substrate, the wall section, and the ceiling portion.

What is claimed is:

1. An electronic device comprising:
   a substrate;
   a wall section disposed on a first surface of the substrate, the wall section being annular in a plan view of the substrate;
   via wiring disposed on the first surface of the substrate, the via wiring having a concave shape when viewed in cross-section;
   a covering layer disposed on a side of the wall section opposite the substrate and away from the via wiring in the plan view; and
   an internal space formed by the substrate, wall section, and covering layer, the internal space being sealed from an exterior.

2. The electronic device according to claim 1, wherein the covering layer has a through-hole, further comprising:
   a sealing layer disposed on a side of the covering layer opposite the internal space and away from the via wiring in the plan view, the sealing layer blocking the through-hole.

3. A pressure sensor comprising:
   the electronic device according to claim 2.

4. An altimeter comprising:
   the electronic device according to claim 2.

5. An electronic apparatus comprising:
   the electronic device according to claim 2.

6. A moving object comprising:
   the electronic device according to claim 2.

7. The electronic device according to claim 1, wherein the wall section includes a silicon compound.

8. The electronic device according to claim 1, wherein when a thickness of the covering layer is set to be A and a width of the internal space is set to be B, a value of A/B is within a range of 0.005 or more and 0.008 or less.

9. The electronic device according to claim 1, wherein the substrate has a diaphragm portion which is bent and deformed by receiving pressure, at a position where at least a portion thereof overlaps the internal space when viewed in the plan view, and
   the diaphragm portion is provided with a sensor element which outputs an electrical signal by distortion.

10. The electronic device according to claim 1, further comprising:
   a circuit section disposed on the first surface of the substrate.

11. A pressure sensor comprising:
   the electronic device according to claim 1.

12. An altimeter comprising:
   the electronic device according to claim 1.

13. An electronic apparatus comprising:
   the electronic device according to claim 1.

14. A moving object comprising:
   the electronic device according to claim 1.

15. The electronic device according to claim 1, further comprising:
   a wiring layer having a portion thereof which is disposed between the covering layer and the substrate.

16. An electronic device comprising:
   a substrate;
   a wall layer disposed on a first surface of the substrate, the wall layer forming a wall section that is annular in a plan view of the substrate;
   via wiring disposed on the first surface of the substrate, the via wiring having a concave shape when viewed in cross-section;
   a covering layer disposed on a side of the wall layer opposite the substrate and away from the via wiring in the plan view, no portion of the covering layer being closer to the substrate than any portion of the wall layer; and
   an internal space formed by the substrate, wall section, and covering layer.

17. The electronic device according to claim 16, wherein the covering layer has a through-hole.

18. The electronic device according to claim 17, further comprising:
   a sealing layer disposed on a side of the covering layer opposite the internal space and away from the via wiring in the plan view, the sealing layer blocking the through-hole.

19. The electronic device according to claim 16, wherein the substrate has a diaphragm portion which is bent and deformed by receiving pressure, at a position where at least a portion thereof overlaps the internal space when viewed in the plan view, and
   the diaphragm portion is provided with a sensor element which outputs an electrical signal by distortion.

20. The electronic device according to claim 16, further comprising:
   a circuit section disposed on the first surface of the substrate.

* * * * *